United States Patent
Rile et al.

(10) Patent No.: US 12,355,013 B2
(45) Date of Patent: Jul. 8, 2025

(54) EMISSION HEIGHT ARRANGEMENTS IN LIGHT-EMITTING DIODE PACKAGES AND RELATED DEVICES AND METHODS

(71) Applicant: CreeLED, Inc., Durham, NC (US)

(72) Inventors: Alexis Rile, Durham, NC (US); Robert Wilcox, Rolesville, NC (US); Colin Blakely, Raleigh, NC (US)

(73) Assignee: CreeLED, Inc., Durham, NC (US)

( * ) Notice: Subject to any disclaimer, the term of this patent is extended or adjusted under 35 U.S.C. 154(b) by 361 days.

(21) Appl. No.: 17/726,072

(22) Filed: Apr. 21, 2022

(65) Prior Publication Data
US 2023/0343757 A1    Oct. 26, 2023

(51) Int. Cl.
*H01L 25/075* (2006.01)
*H10H 20/01* (2025.01)
*H10H 20/84* (2025.01)

(52) U.S. Cl.
CPC ......... *H01L 25/0753* (2013.01); *H10H 20/01* (2025.01); *H10H 20/84* (2025.01); *H10H 20/034* (2025.01)

(58) Field of Classification Search
CPC .............................................. H01L 2933/0025
See application file for complete search history.

(56) References Cited

U.S. PATENT DOCUMENTS

| | | |
|---|---|---|
| D521,948 S | 5/2006 | Inoue |
| D573,554 S | 7/2008 | Kobayakawa |
| D574,336 S | 8/2008 | Okada et al. |
| D575,244 S | 8/2008 | Lee |
| D576,574 S | 9/2008 | Kobayakawa |
| D596,592 S | 7/2009 | Yong et al. |
| D602,451 S | 10/2009 | Gielen |

(Continued)

FOREIGN PATENT DOCUMENTS

| | | |
|---|---|---|
| CN | 114256438 A | 3/2022 |
| JP | D1353072 A | 3/2009 |

(Continued)

OTHER PUBLICATIONS

International Search Report and Written Opinion for International Patent Application No. PCT/US2023/018595, mailed Jul. 31, 2023, 13 pages.

(Continued)

*Primary Examiner* — Yu-Hsi D Sun
(74) *Attorney, Agent, or Firm* — Withrow & Terranova, P.L.L.C.

(57) ABSTRACT

Light-emitting diode (LED) packages and more particularly emission height arrangements in LED packages and related devices and methods are disclosed. LED packages, LED chips, and related device arrangements are disclosed that include various combinations of LED chip types, lumiphoric materials, and/or cover structures that are arranged together while also providing a substantially uniform emission height for corresponding light-emitting surfaces. LED chips may be configured with different heights or thicknesses that compensate for variations in lumiphoric materials and/or cover structures utilized to provide different emission colors. Corresponding LED packages and/or LED chips with different emission colors may be assembled near one another with improved emission height uniformity.

15 Claims, 7 Drawing Sheets

(56) References Cited

U.S. PATENT DOCUMENTS

| | | | |
|---|---|---|---|
| D615,504 S | 5/2010 | Keller et al. | |
| D615,505 S | 5/2010 | Butterworth et al. | |
| D623,151 S | 9/2010 | Hwang et al. | |
| D623,152 S | 9/2010 | Hwang et al. | |
| D642,142 S | 7/2011 | Kuwaharada et al. | |
| D649,943 S | 12/2011 | Kuwaharada et al. | |
| D650,342 S | 12/2011 | Kuwaharada et al. | |
| D650,343 S | 12/2011 | Andrews et al. | |
| D660,257 S | 5/2012 | Andrews et al. | |
| D667,802 S | 9/2012 | Otaki et al. | |
| D672,731 S | 12/2012 | Bergmann et al. | |
| D673,126 S | 12/2012 | Donofrio et al. | |
| D673,127 S | 12/2012 | Cho et al. | |
| D674,758 S | 1/2013 | Wu et al. | |
| D675,169 S | 1/2013 | Chou | |
| D691,973 S | 10/2013 | Donofrio et al. | |
| D697,642 S | 1/2014 | Amari et al. | |
| D704,154 S | 5/2014 | Andrews et al. | |
| D705,957 S | 5/2014 | Lin | |
| D711,841 S | 8/2014 | Britt et al. | |
| D712,849 S | 9/2014 | Britt et al. | |
| D713,804 S | 9/2014 | Britt et al. | |
| D718,258 S | 11/2014 | Lowes et al. | |
| 9,006,763 B2 | 4/2015 | Ueno et al. | |
| 9,070,850 B2 | 6/2015 | Keller et al. | |
| D738,832 S | 9/2015 | Hussell et al. | |
| D741,821 S | 10/2015 | Song | |
| D749,051 S | 2/2016 | Clark et al. | |
| 9,349,929 B2 | 5/2016 | Clark et al. | |
| D762,183 S | 7/2016 | Kim et al. | |
| D762,184 S | 7/2016 | Kiridoshi et al. | |
| D763,472 S | 8/2016 | Watson-Levack | |
| D763,473 S | 8/2016 | Watson-Levack | |
| 9,461,024 B2 | 10/2016 | Hussell et al. | |
| 9,515,055 B2 | 12/2016 | Britt et al. | |
| D777,122 S | 1/2017 | Bergmann et al. | |
| 9,627,361 B2 | 4/2017 | Andrews et al. | |
| D790,486 S | 6/2017 | Reiherzer et al. | |
| D800,679 S | 10/2017 | Omori | |
| 9,887,327 B2 | 2/2018 | Reiherzer et al. | |
| D833,989 S | 11/2018 | Tamura | |
| D844,576 S | 4/2019 | Miura | |
| 10,388,838 B2 | 8/2019 | Hung et al. | |
| 10,439,112 B2 | 10/2019 | Clark et al. | |
| 10,516,081 B1 | 12/2019 | Xin et al. | |
| 10,522,722 B2 | 12/2019 | Damborsky et al. | |
| 10,854,780 B2 | 12/2020 | Hung et al. | |
| D915,308 S | 4/2021 | Maruyama | |
| D915,309 S | 4/2021 | Maruyama | |
| D926,714 S | 8/2021 | Wilcox et al. | |
| 11,456,443 B2 | 9/2022 | Montgomery | |
| 11,552,229 B2 | 1/2023 | Damborsky et al. | |
| D996,377 S | 8/2023 | Celano et al. | |
| D996,378 S | 8/2023 | Trinkle et al. | |
| D100,040 S | 10/2023 | Wilcox et al. | |
| D103,671 S | 7/2024 | Celano et al. | |
| 2005/0173721 A1 | 8/2005 | Isoda | |
| 2007/0253209 A1 | 11/2007 | Loh et al. | |
| 2008/0054280 A1 | 3/2008 | Reginelli et al. | |
| 2010/0117099 A1 | 5/2010 | Leung | |
| 2010/0140633 A1 | 6/2010 | Emerson | |
| 2010/0140634 A1 | 6/2010 | van de Ven et al. | |
| 2010/0252851 A1 | 10/2010 | Emerson et al. | |
| 2010/0258827 A1 | 10/2010 | Lee et al. | |
| 2011/0062482 A1 | 3/2011 | Solomensky et al. | |
| 2011/0175117 A1 | 7/2011 | Jagt et al. | |
| 2011/0210358 A1 | 9/2011 | Kim et al. | |
| 2011/0220920 A1 | 9/2011 | Collins et al. | |
| 2012/0086024 A1 | 4/2012 | Andrews et al. | |
| 2012/0087108 A1* | 4/2012 | Ke | H01L 25/0753 257/E33.012 |
| 2012/0112661 A1 | 5/2012 | van de Ven et al. | |
| 2013/0092960 A1 | 4/2013 | Wilcox et al. | |
| 2013/0105835 A1 | 5/2013 | Wu et al. | |
| 2013/0141920 A1 | 6/2013 | Emerson et al. | |
| 2013/0322068 A1 | 12/2013 | Clark et al. | |
| 2013/0322070 A1 | 12/2013 | Clark et al. | |
| 2013/0322088 A1 | 12/2013 | Huang et al. | |
| 2014/0131748 A1 | 5/2014 | Song | |
| 2014/0291715 A1 | 10/2014 | Reiherzer et al. | |
| 2015/0179903 A1 | 6/2015 | Pun et al. | |
| 2015/0221839 A1 | 8/2015 | Park et al. | |
| 2016/0079478 A1 | 3/2016 | Kong et al. | |
| 2017/0069606 A1 | 3/2017 | Gould et al. | |
| 2017/0069806 A1 | 3/2017 | Kim et al. | |
| 2017/0084587 A1 | 3/2017 | Hung et al. | |
| 2017/0179352 A1 | 6/2017 | Song | |
| 2018/0151790 A1 | 5/2018 | Kim et al. | |
| 2018/0357948 A1 | 12/2018 | Chen et al. | |
| 2019/0198709 A1 | 6/2019 | Wildeson et al. | |
| 2019/0355886 A9 | 11/2019 | Hussell | |
| 2020/0105974 A1 | 4/2020 | Ozeki et al. | |
| 2020/0212277 A1 | 7/2020 | Ozeki et al. | |
| 2020/0313058 A1 | 10/2020 | Ukawa et al. | |
| 2020/0335673 A1 | 10/2020 | Kim et al. | |
| 2020/0411730 A1* | 12/2020 | Andrews | H01L 27/153 |
| 2021/0028401 A1 | 1/2021 | Montgomery et al. | |
| 2021/0083153 A1 | 3/2021 | Kayama et al. | |
| 2022/0005987 A1 | 1/2022 | Wilcox et al. | |
| 2022/0165923 A1 | 5/2022 | Kamp et al. | |
| 2022/0415977 A1 | 12/2022 | Lee | |
| 2023/0140302 A1 | 5/2023 | Miller et al. | |
| 2023/0163261 A1 | 5/2023 | Lu et al. | |
| 2023/0260972 A1 | 8/2023 | Celano et al. | |
| 2023/0261154 A1 | 8/2023 | Trinkle et al. | |

FOREIGN PATENT DOCUMENTS

| | | |
|---|---|---|
| JP | D1655194 A | 3/2020 |
| TW | D140189 S | 4/2011 |
| TW | D141208 S | 6/2011 |
| TW | D149503 S | 10/2012 |
| TW | D157837 S | 12/2013 |
| TW | D170851 S | 10/2015 |
| TW | D188043 S | 1/2018 |
| WO | 2010035206 A1 | 4/2010 |
| WO | 2018088671 A1 | 5/2018 |
| WO | 2021023532 A1 | 2/2021 |

OTHER PUBLICATIONS

Notice of Allowance for Taiwanese Patent Application No. 112303066, mailed Feb. 19, 2024, 3 pages.

Notice of Allowance for U.S. Appl. No. 29/877,887, mailed Mar. 6, 2024, 8 pages.

International Search Report and Written Opinion for International Patent Application No. PCT/US2023/062635, mailed May 22, 2023, 13 pages.

Notification to Grant for Chinese Patent Application No. 202230530277.0, mailed Feb. 22, 2024, 4 pages.

Office Action for Taiwanese Patent Application No. 112112910, mailed Feb. 22, 2024, 17 pages.

Office Action for Chinese Patent Application No. 202230530277.0, mailed Jul. 21, 2023, 8 pages.

Preliminary Examination Report for Taiwanese Patent Application No. 112103007, mailed Sep. 20, 2023, 17 pages.

Notice of Allowance for Taiwanese Patent Application No. 111303915, mailed Sep. 1, 2023, 5 pages.

MG Chemicals, "Epoxy Potting Compunds," Technical Data Sheet, Sep. 27, 2021, MG Chemicals, web.archive/org/web/20210927001739/ https://mgchemicals.com/products/potting-compounds/epoxy-potting/ high-temperature-epoxy/, 3 pages.

MG Chemicals, "832HT: High Temperature Epoxy, Encapsulating and Potting Compound," Technical Data Sheet, Nov. 21, 2019, MG Chemicals, web.archive.org/web/20201028085732/https://mgchemicals.com/downloads/tds/tds-832ht-2parts.pdf, 2 pages.

Non-Final Office Action for U.S. Appl. No. 17/674,430, mailed Jul. 30, 2024, 22 pages.

Notice of Allowance for U.S. Appl. No. 29/877,879, mailed Aug. 26, 2024, 9 pages.

(56) References Cited

OTHER PUBLICATIONS

U.S. Appl. No. 17/674,430, filed Feb. 17, 2022.
U.S. Appl. No. 29/829,994, filed Mar. 9, 2022.
U.S. Appl. No. 17/674,448, filed Feb. 17, 2022.
U.S. Appl. No. 29/827,155, filed Feb. 17, 2022.
U.S. Appl. No. 17/103,121, filed Nov. 24, 2020.
U.S. Appl. No. 17/514,012, filed Oct. 29, 2021.
Examination Report for Taiwanese Patent Application No. 112303066, mailed Oct. 19, 2023, 9 pages.
Examination Report for Taiwanese Patent Application No. 111303915, mailed Mar. 24, 2023, 4 pages.
Notice of Allowance for U.S. Appl. No. 29/829,994, mailed Mar. 15, 2023, 8 pages.
Notice of Allowance for U.S. Appl. No. 29/827,155, mailed Mar. 15, 2023, 9 pages.
Notification to Grant for Chinese Patent Application No. 202430228569.8, mailed Nov. 27, 2024, 4 pages.
Final Office Action for U.S. Appl. No. 17/674,430, mailed Dec. 27, 2024, 27 pages.
Non-Final Office Action for U.S. Appl. No. 17/674,448, mailed Dec. 11, 2024, 20 pages.
Reasons for Rejection for Taiwanese Patent Application No. 112112910, mailed Nov. 12, 2024, 8 pages.
Notice of Allowance for Taiwanese Patent Application No. 112112910, mailed Apr. 14, 2025, 5 pages.

\* cited by examiner

EMISSION HEIGHT ARRANGEMENTS IN LIGHT-EMITTING DIODE PACKAGES AND RELATED DEVICES AND METHODS

FIELD OF THE DISCLOSURE

The present disclosure relates to light-emitting diode (LED) packages and more particularly to emission height arrangements in LED packages and related devices and methods.

BACKGROUND

Solid-state lighting devices such as light-emitting diodes (LEDs) are increasingly used in both consumer and commercial applications. Advancements in LED technology have resulted in highly efficient and mechanically robust light sources with a long service life. Accordingly, modern LEDs have enabled a variety of new display applications and are being increasingly utilized for general illumination applications, often replacing incandescent and fluorescent light sources.

LEDs are solid-state devices that convert electrical energy to light and generally include one or more active layers of semiconductor material (or an active region) arranged between oppositely doped n-type and p-type layers. When a bias is applied across the doped layers, holes and electrons are injected into the one or more active layers where they recombine to generate emissions such as visible light or ultraviolet emissions. An LED chip typically includes an active region that may be fabricated, for example, from silicon carbide, gallium nitride, gallium phosphide, indium phosphide, aluminum nitride, gallium arsenide-based materials, and/or from organic semiconductor materials. Photons generated by the active region are initiated in all directions.

Lumiphoric materials, such as phosphors, may be arranged in light emission paths of LED emitters to convert portions of light to different wavelengths. LED packages have been developed that can provide mechanical support, electrical connections, and encapsulation for LED emitters. Light emissions that exit surfaces of LED emitters typically interact with various elements or surfaces of the LED package and lumiphoric materials before exiting, thereby increasing opportunities for light loss and potential non-uniformity of light emissions. As such, there can be challenges in producing high quality light with desired emission characteristics while also providing high light emission efficiency in LED packages.

The art continues to seek improved LEDs and solid-state lighting devices having desirable illumination characteristics capable of overcoming challenges associated with conventional lighting devices.

SUMMARY

Aspects disclosed herein relate to light-emitting diode (LED) packages and more particularly to emission height arrangements in LED packages and related devices and methods. LED packages, LED chips, and related device arrangements are disclosed that include various combinations of LED chip types, lumiphoric materials, and/or cover structures that are arranged together while also providing a substantially uniform emission height for corresponding light-emitting surfaces. LED chips may be configured with different heights or thicknesses that compensate for variations in lumiphoric materials and/or cover structures utilized to provide different emission colors. In this manner, LED packages and/or LED chips with different emission colors may be assembled near one another with improved emission height uniformity.

In one aspect, a method comprises: providing a first LED chip and a first lumiphoric material layer that define a first color point; providing a second LED chip that defines a second color point that is different than the first color point; and reducing a thickness of at least one of the first LED chip and the second LED chip such that a first emission height formed by the first LED chip and the first lumiphoric material layer is within 100 microns ($\mu$m) of a second emission height of the second LED chip. In certain embodiments, the first emission height is defined as a perpendicular distance from a mounting surface of the first LED package to a topmost emission surface of the first LED package, and the second emission height is defined as a perpendicular distance from a mounting surface of the second LED chip to a topmost emission surface of the second LED chip. In certain embodiments, the topmost emission surface of the first LED chip is defined at a topmost surface of the first lumiphoric material layer and the topmost emission surface of the second LED chip is defined at a topmost surface of the second LED chip. In certain embodiments, the thickness of the first LED chip is reduced an amount that corresponds with a thickness of the first lumiphoric material layer. In certain embodiments, reducing a thickness of at least one of the first LED chip and the second LED chip comprises reducing a thickness of a substrate of at least one of the first LED chip and the second LED chip. In certain embodiments, the first emission height is within 60 $\mu$m of the second emission height. In certain embodiments, the first emission height is within 30 $\mu$m of the second emission height.

In another aspect, a method comprises providing a first LED chip and a first lumiphoric material layer that define a first color point; providing a second LED chip and a second lumiphoric material layer that define a second color point that is different than the first color point; and reducing a thickness of at least one of the first LED chip and the second LED chip such that a first emission height formed by the first LED chip and the first lumiphoric material layer is within 100 microns ($\mu$m) of a second emission height formed by the second LED chip and the second lumiphoric material layer. In certain embodiments, the first emission height is defined as a perpendicular distance from a mounting surface of the first LED chip to a topmost emission surface of the first LED chip, and the second emission height is defined as a perpendicular distance from a mounting surface of the second LED chip to a topmost emission surface of the second LED chip. In certain embodiments, the topmost emission surface of the first LED chip is defined at a topmost surface of the first lumiphoric material layer and the topmost emission surface of the second LED chip is defined at a topmost surface of the second lumiphoric material layer. In certain embodiments, reducing a thickness of at least one of the first LED chip and the second LED chip comprises reducing a thickness of a substrate of at least one of the first LED chip and the second LED chip. In certain embodiments, the first emission height is within 60 $\mu$m of the second emission height. In certain embodiments, the first emission height is within 30 $\mu$m of the second emission height.

In another aspect, a light-emitting device comprises: a first LED package comprising: a first submount; a first LED chip on the first submount; and a first lumiphoric material layer on the first LED chip, wherein the first LED chip and the first lumiphoric material layer define a first color point, and a first emission height is defined as a perpendicular distance from a mounting surface of the first LED package to a topmost emission surface of the first LED package; and a second LED package comprising: a second submount; and a second LED chip on the second submount, wherein the second LED chip at least partially defines a second color point that is different than the first color point, and wherein a second emission height is defined as a perpendicular distance from a mounting surface of the second LED package to a topmost emission surface of the second LED package; wherein the first emission height is within 100 microns (μm) of the second emission height. In certain embodiments, the first emission height is within 60 μm of the second emission height. In certain embodiments, the first emission height is within 30 μm of the second emission height. In certain embodiments, the topmost emission surface of the first LED package is defined at a topmost surface of the first lumiphoric material layer and the topmost emission surface of the second LED package is defined at a topmost surface of the second LED chip. The light emitting device may further comprise a second lumiphoric material layer on the second LED chip, wherein the second LED chip and the second lumiphoric material layer define the second color point, wherein the topmost emission surface of the first LED package is defined at a topmost surface of the first lumiphoric material layer and the topmost emission surface of the second LED package is defined at a topmost surface of the second lumiphoric material layer. In certain embodiments, the first lumiphoric material layer is provided as a coating on the first LED chip. In certain embodiments, the first lumiphoric material layer is arranged on or within a chip cover that is attached to the first LED chip.

In another aspect, an LED package comprises: a submount; a first LED chip on the submount; a first lumiphoric material layer on the first LED chip, wherein the first LED chip and the first lumiphoric material layer define a first color point and a first emission height is defined as a perpendicular distance from a mounting surface of the first LED chip to a topmost emission surface of the first LED chip; and a second LED chip on the submount, wherein the second LED chip at least partially defines a second color point that is different than the first color point, and wherein a second emission height is defined as a perpendicular distance from a mounting surface of the second LED chip to a topmost emission surface of the second LED chip; wherein the first emission height is within 100 μm of the second emission height. In certain embodiments, the first emission height is within 60 μm of the second emission height. In certain embodiments, the first emission height is within 30 μm of the second emission height. In certain embodiments, the topmost emission surface of the first LED chip is defined at a topmost surface of the first lumiphoric material layer and the topmost emission surface of the second LED chip is defined at a topmost surface of the second LED chip. The LED package may further comprise a second lumiphoric material layer on the second LED chip, wherein the second LED chip and the second lumiphoric material layer define the second color point, wherein the topmost emission surface of the first LED chip is defined at a topmost surface of the first lumiphoric material layer and the topmost emission surface of the second LED chip is defined at a topmost surface of the second lumiphoric material layer. In certain embodiments, the first lumiphoric material is provided as a coating on the first LED chip. In certain embodiments, the first lumiphoric material layer is arranged on or within a chip cover that is attached to the first LED chip In another aspect, any of the foregoing aspects individually or together, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments are described herein with reference to schematic illustrations of embodiments of the disclosure. As such, the actual dimensions of the layers and elements can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure. Additionally, sizes of structures or regions may be exaggerated relative to other structures or regions for illustrative purposes and, thus, are provided to illustrate the general structures of the present subject matter and may or may not be drawn to scale. Common elements between figures may be shown herein with common element numbers and may not be subsequently re-described.

Aspects disclosed herein relate to light-emitting diode (LED) packages and more particularly to emission height arrangements in LED packages and related devices and methods. LED packages, LED chips, and related device arrangements are disclosed that include various combinations of LED chip types, lumiphoric materials, and/or cover structures that are arranged together while also providing a substantially uniform emission height for corresponding light-emitting surfaces. LED chips may be configured with different heights or thicknesses that compensate for variations in lumiphoric materials and/or cover structures utilized to provide different emission colors. In this manner, LED packages and/or LED chips with different emission colors may be assembled near one another with improved emission height uniformity.

Before delving into specific details of various aspects of the present disclosure, an overview of various elements that may be included in exemplary LEDs of the present disclosure is provided for context. An LED chip typically comprises an active LED structure or region that can have many different semiconductor layers arranged in different ways. The fabrication and operation of LEDs and their active structures are generally known in the art and are only briefly discussed herein. The layers of the active LED structure can be fabricated using known processes with a suitable process being fabrication using metal organic chemical vapor deposition. The layers of the active LED structure can comprise many different layers and generally comprise an active layer sandwiched between n-type and p-type oppositely doped epitaxial layers, all of which are formed successively on a growth substrate. It is understood that additional layers and elements can also be included in the active LED structure, including, but not limited to, buffer layers, nucleation layers, super lattice structures, undoped layers, cladding layers, contact layers, and current-spreading layers and light extraction layers and elements. The active layer can comprise a single quantum well, a multiple quantum well, a double heterostructure, or super lattice structures.

The active LED structure can be fabricated from different material systems, with some material systems being Group III nitride-based material systems. Group III nitrides refer to those semiconductor compounds formed between nitrogen (N) and the elements in Group III of the periodic table, usually aluminum (Al), gallium (Ga), and indium (In). Gallium nitride (GaN) is a common binary compound. Group III nitrides also refer to ternary and quaternary compounds such as aluminum gallium nitride (AlGaN), indium gallium nitride (InGaN), and aluminum indium gallium nitride (AlInGaN). For Group III nitrides, silicon (Si) is a common n-type dopant and magnesium (Mg) is a common p-type dopant. Accordingly, the active layer, n-type layer, and p-type layer may include one or more layers of GaN, AlGaN, InGaN, and AlInGaN that are either undoped or doped with Si or Mg for a material system based on Group III nitrides. Other material systems include silicon carbide (SiC), organic semiconductor materials, and other Group III-V systems such as gallium phosphide (GaP), gallium arsenide (GaAs), indium phosphide (InP), and related compounds.

The active LED structure may be grown on a growth substrate that can include many materials, such as sapphire, SiC, aluminum nitride (AlN), GaN, GaAs, glass, or Si. SiC has certain advantages, such as a closer crystal lattice match to Group III nitrides than other substrates and results in Group III nitride films of high quality. SiC also has a very high thermal conductivity so that the total output power of Group III nitride devices on SiC is not limited by the thermal dissipation of the substrate. Sapphire is another common substrate for Group III nitrides and also has certain advantages, including being lower cost, having established manufacturing processes, and having good light-transmissive optical properties.

Different embodiments of the active LED structure can emit different wavelengths of light depending on the composition of the active layer and n-type and p-type layers. In some embodiments, the active LED structure emits blue light with a peak wavelength range of approximately 430 nanometers (nm) to 480 nm. In other embodiments, the active LED structure emits green light with a peak wavelength range of 500 nm to 570 nm. In other embodiments, the active LED structure emits red light with a peak wavelength range of 600 nm to 650 nm. In certain embodiments, the active LED structure may be configured to emit light that is outside the visible spectrum, including one or more portions of the ultraviolet (UV) spectrum. The UV spectrum is typically divided into three wavelength range categories detonated with letters A, B, and C. In this manner, UV-A light is typically defined as a peak wavelength range from 315 nm to 400 nm, UV-B is typically defined as a peak wavelength range from 280 nm to 315 nm, and UV-C is typically defined as a peak wavelength range from 100 nm to 280 nm. UV LEDs are of particular interest for use in applications related to the disinfection of microorganisms in air, water, and surfaces, among others. In other applications, UV LEDs may also be provided with one or more lumiphoric materials to provide LED packages with aggregated emissions having a broad spectrum and improved color quality for visible light applications.

An LED chip can also be covered with one or more lumiphoric materials (also referred to herein as lumiphors), such as phosphors, such that at least some of the light from the LED chip is absorbed by the one or more lumiphors and is converted to one or more different wavelength spectra according to the characteristic emission from the one or more lumiphors. In this regard, at least one lumiphor receiving at least a portion of the light generated by the LED source may re-emit light having different peak wavelength than the LED source. An LED source and one or more lumiphoric materials may be selected such that their combined output results in light with one or more desired characteristics such as color, color point, intensity, spectral density, etc. In certain embodiments, aggregate emissions of LED chips, optionally in combination with one or more lumiphoric materials, may be arranged to provide cool white, neutral white, or warm white light, such as within a color temperature range of 2500 Kelvin (K) to 10,000 K. In certain embodiments, lumiphoric materials having cyan, green, amber, yellow, orange, and/or red peak wavelengths may be used. In certain embodiments, the combination of the LED chip and the one or more lumiphors (e.g., phosphors) emits a generally white combination of light. The one or more phosphors may include yellow (e.g., YAG:Ce), green (e.g., LuAg:Ce), and red (e.g., $Ca_{1-x-y}Sr_xEu_yAlSiN_3$) emitting phosphors, and combinations thereof. In other embodiments, the LED chip and corresponding lumiphoric material may be configured to primarily emit converted light from the lumiphoric material so that aggregate emissions include little to no perceivable emissions that correspond to the LED chip itself.

Lumiphoric materials as described herein may be or include one or more of a phosphor, a scintillator, a lumiphoric ink, a quantum dot material, a day glow tape, and the like. Lumiphoric materials may be provided by any suitable means, for example, direct coating on one or more surfaces of an LED, dispersal in an encapsulant material configured to cover one or more LEDs, and/or coating on one or more optical or support elements (e.g., by powder coating, inkjet printing, or the like). In certain embodiments, lumiphoric materials may be downconverting or upconverting, and combinations of both downconverting and upconverting materials may be provided. In certain embodiments, multiple different (e.g., compositionally different) lumiphoric materials arranged to produce different peak wavelengths may be arranged to receive emissions from one or more LED chips. One or more lumiphoric materials may be provided on one or more portions of an LED chip in various configurations. In certain embodiments, lumiphoric materials may be provided over one or more surfaces of LED chips, while other surfaces of such LED chips may be devoid of lumiphoric material. In certain embodiments, a top surface of an LED chip may include lumiphoric material, while one or more side surfaces of an LED chip may be devoid of lumiphoric material. In certain embodiments, all or substantially all outer surfaces of an LED chip (e.g., other than contact-defining or mounting surfaces) may be coated or otherwise covered with one or more lumiphoric materials. In certain embodiments, one or more lumiphoric materials may be arranged on or over one or more surfaces of an LED chip in a substantially uniform manner. In other embodiments, one or more lumiphoric materials may be arranged on or over one or more surfaces of an LED chip in a manner that is non-uniform with respect to one or more of material composition, concentration, and thickness. In certain embodiments, the loading percentage of one or more lumiphoric materials may be varied on or among one or more outer surfaces of an LED chip. In certain embodiments, one or more lumiphoric materials may be patterned on portions of one or more surfaces of an LED chip to include one or more stripes, dots, curves, or polygonal shapes. In certain embodiments, multiple lumiphoric materials may be arranged in different discrete regions or discrete layers on or over an LED chip.

In certain embodiments, one or more lumiphoric materials may be provided as at least a portion of a wavelength conversion element or cover structure that is provided over an LED chip. Wavelength conversion elements or cover structures may include a support element and one or more lumiphoric materials that are provided by any suitable means, such as by coating a surface of the support element or by incorporating the lumiphoric materials within the support element. In some embodiments, the support element may be composed of a transparent material, a semi-transparent material, or a light-transmissive material, such as sapphire, SiC, silicone, and/or glass (e.g., borosilicate and/or fused quartz). Wavelength conversion elements and cover structures of the present disclosure may be formed from a bulk material which is optionally patterned and then singulated. In certain embodiments, the patterning may be performed by an etching process (e.g., wet or dry etching), or by another process that otherwise alters a surface, such as with a laser or saw. In certain embodiments, wavelength conversion elements and cover structures may be thinned before or after the patterning process is performed. In certain embodiments, wavelength conversion elements and cover structures may comprise a generally planar upper surface that corresponds to a light emission area of the LED package.

Wavelength conversion elements and cover structures may be attached to one or more LED chips using, for example, a layer of transparent adhesive. In certain embodiments, the layer of the transparent adhesive may include silicone with a refractive index in a range of about 1.3 to about 1.6 that is less than a refractive index of the LED chip on which the wavelength conversion element is placed. In various embodiments, wavelength conversion elements may comprise configurations such as phosphor-in-glass or ceramic phosphor plate arrangements. Phosphor-in-glass or ceramic phosphor plate arrangements may be formed by mixing phosphor particles with glass frit or ceramic materials, pressing the mixture into planar shapes, and firing or sintering the mixture to form a hardened structure that can be cut or separated into individual wavelength conversion elements.

As used herein, a layer or region of a light-emitting device may be considered to be "transparent" when at least 80% of emitted radiation that impinges on the layer or region emerges through the layer or region. Moreover, as used herein, a layer or region of an LED is considered to be "reflective" or embody a "mirror" or a "reflector" when at least 80% of the emitted radiation that impinges on the layer or region is reflected. In some embodiments, the emitted radiation comprises visible light such as blue and/or green LEDs with or without lumiphoric materials. In other embodiments, the emitted radiation may comprise nonvisible light. For example, in the context of GaN-based blue and/or green LEDs, silver (Ag) may be considered a reflective material (e.g., at least 80% reflective). In the case of UV LEDs, appropriate materials may be selected to provide a desired, and in some embodiments high, reflectivity and/or a desired, and in some embodiments low, absorption. In certain embodiments, a "light-transmissive" material may be configured to transmit at least 50% of emitted radiation of a desired wavelength.

The present disclosure can be useful for LED chips having a variety of geometries, such as vertical geometry or lateral geometry. A vertical geometry LED chip typically includes anode and cathode connections on opposing sides or faces of the LED chip. A lateral geometry LED chip typically includes both anode and cathode connections on the same side of the LED chip that is opposite a substrate, such as a growth substrate. In certain embodiments, a lateral geometry LED chip may be mounted on a submount of an LED package such that the anode and cathode connections are on a face of the LED chip that is opposite the submount. In this configuration, wire bonds may be used to provide electrical connections with the anode and cathode connections. In other embodiments, a lateral geometry LED chip may be flip-chip mounted on a surface of a submount of an LED package such that the anode and cathode connections are on a face of the active LED structure that is adjacent to the submount. In this configuration, electrical traces or patterns may be provided on the submount for providing electrical connections to the anode and cathode connections of the LED chip. In a flip-chip configuration, the active LED structure is configured between the substrate of the LED chip and the submount for the LED package. Accordingly, light emitted from the active LED structure may pass through the substrate in a desired emission direction. In other embodiments, an active LED structure may be bonded to a carrier submount, and the growth substrate may be removed such that light may exit the active LED structure without passing through the growth substrate.

According to aspects of the present disclosure, LED packages may include one or more elements, such as lumiphoric materials, encapsulants, light-altering materials, lenses, and electrical contacts, among others, that are provided with one or more LED chips. In certain aspects, an LED package may include a support member, such as a submount or a leadframe. Suitable materials for the submount include, but are not limited to, ceramic materials such as aluminum oxide or alumina, AlN, or organic insulators like polyimide (PI) and polyphthalamide (PPA). In other embodiments, a submount may comprise a printed circuit board (PCB), sapphire, Si or any other suitable material. For PCB embodiments, different PCB types can be used such as standard FR-4 PCB, metal core PCB, or any other type of PCB. In still further embodiments, the support structure may embody a lead frame structure. Light-altering materials may be arranged within LED packages to reflect or otherwise redirect light from the one or more LED chips in a desired emission direction or pattern.

As used herein, light-altering materials may include many different materials including light-reflective materials that reflect or redirect light, light-absorbing materials that absorb light, and materials that act as a thixotropic agent. As used herein, the term "light-reflective" refers to materials or particles that reflect, refract, scatter, or otherwise redirect light. For light-reflective materials, the light-altering material may include at least one of fused silica, fumed silica, titanium dioxide ($TiO_2$), or metal particles suspended in a binder, such as silicone or epoxy. In certain aspects, the particles may have an index or refraction that is configured to refract light emissions in a desired direction. In certain aspects, light-reflective particles may also be referred to as light-scattering particles. A weight ratio of the light-reflective particles or scattering particles to a binder may comprise a range of about 0.15:1 to about 0.5:1, or in a range of about 0.5:1 to about 1:1, or in a range of about 1:1 to about 2:1, depending on a desired viscosity before curing. For light-absorbing materials, the light-altering material may include at least one of carbon, silicon, or metal particles suspended in a binder, such as silicone or epoxy. The light-reflective materials and the light-absorbing materials may comprise nanoparticles. In certain embodiments, the light-altering material may comprise a generally white color to reflect and redirect light. In other embodiments, the light-altering material may comprise a generally opaque color, such as black or gray for absorbing light and increasing contrast. In certain embodiments, the light-altering material includes both light-reflective material and light-absorbing material suspended in a binder.

LED packages have been developed that include multiple LED chips that are clustered together to provide increased light output and/or the capability for a single LED package to emit multiple colors and/or peak wavelengths of light. Relative sizes or areas of individual LED chips within an LED package may be selected according to desired emission intensities and profiles. In certain embodiments, the LED chips within an LED package may have smaller sizes such as 0.5 millimeters (mm) by 0.5 mm and/or larger sizes such as 2 mm by 2 mm, or other ranges from 0.5 mm by 0.5 mm to 1 mm by 1 mm. In certain embodiments, a longest lateral dimension of each LED chip may be in a range from 0.5 mm to 2 mm, or in a range from 1 mm to 2 mm, or in a range from 0.5 mm to 1 mm. In such ranges where at least one dimension is 0.5 mm or greater, the LED chips may be well suited for providing high output powers in a compact footprint.

For multiple color LED applications, devices may be formed where multiple LED packages of different emission colors are mounted in close proximity to each other on an underlying support element, such as a printed circuit board. In other multiple color LED applications, multiple individually formed LED chips may be grouped together within a single LED package. In either case, separately formed LED chips may have sizes, shapes, emission profiles, and/or voltage requirements that vary, particularly for LED chips that emit different peak wavelengths of light. Such variations can lead to nonuniform light emissions, particularly when various LED chips having differing heights are arranged in close proximity to one another, either in separate LED packages or within a common LED package. When such variations are present, an aggregate light-emitting surface collectively formed by the multiple LED chips may have a variable emission height, thereby leading to undesirable emission nonuniformities. According to aspects of the present disclosure, LED packages, LED chips, and related device arrangements are provided where different combinations of LED chip types, lumiphoric materials, and cover structures are arranged together while also providing a substantially uniform emission height for an aggregate light-emitting surface.

Figure 1:
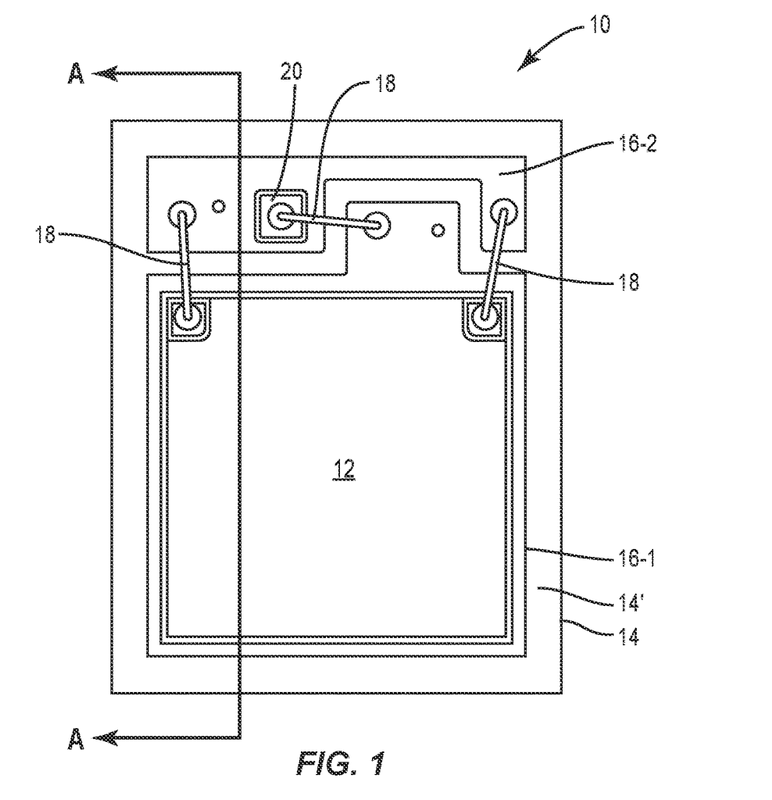
FIG. 1 is a top view of a light-emitting diode (LED) package that includes an LED chip mounted on a submount according to principles of the present disclosure.

FIG. 1 is a top view of an LED package 10 that includes an LED chip 12 mounted on a submount 14 according to principles of the present disclosure. A number of metal traces 16-1 to 16-2 are arranged on a first side 14' of the submount 14 for providing electrical connections to the LED chip 12. The metal traces 16-1 to 16-2 may include any number of metals and/or metal layers, including copper (Cu), nickel (Ni), palladium (Pd), gold (Au), or alloys thereof, among others that are patterned on the submount 14. Depending on the orientation of the LED chip 12, a number of wire bonds 18 may be employed to electrically connect the LED chip 12 to at least one of the metal traces 16-1 to 16-2. In certain embodiments, an electrical overstress device 20 may be provided on the metal trace 16-2 to provide electrical overstress protection for the LED chip 12. The electrical overstress device 20 may embody an electrostatic discharge chip and/or a Zener diode and in certain embodiments, the electrical overstress device 20 may be electrically connected between the metal traces 16-1 to 16-2 by way of one of the wire bonds 18.

The LED chip 12 may be configured to generate many different wavelengths of light, depending on the application. For multiple color applications, several of the LED packages 10 may be provided in close proximity to one another as part of a larger device, where the LED chip 12 in each LED package 10, alone or in combination with lumiphoric materials, is configured to generate different emission colors. In order to generate different emission colors, the LED chip 12 and the lumiphoric material, when present, may be formed with structural differences that include variations in dimensions within each LED package 10. In this regard, emission heights within each LED package 10 may be different, thereby promoting aggregate emission nonuniformities when assembled in close proximity to one another.

As used herein, an emission height for an LED chip or LED package may be defined as a height of a topmost emission surface as measured from an underlying mounting surface that is common to another LED chip or LED package. The topmost emission surface may be defined as a topmost surface of a light-generating element of the LED chip or LED package. A light-generating element of an LED chip or LED package may be defined as the LED chip itself and/or any lumiphoric materials that may be present. For example, for an LED chip that does not include a lumiphoric material, a topmost emission surface may be defined at a topmost surface of the LED chip. In another example, for an LED chip that includes a lumiphoric material on the LED chip, the topmost emission surface may be defined at a topmost surface of the lumiphoric material. In the context of an LED package, an emission height may be measured as a perpendicular distance from a mounting surface of the LED package to the topmost emission surface of the light-generating element. In the context of a multiple-chip LED package, an emission height may be measured as a perpendicular distance from a mounting surface within the package that is common for the multiple chips to the topmost emission surface of the light-generating element for each LED chip.

According to aspects of the present disclosure, emission height arrangements for multiple LED chips and/or multiple LED packages of differing emission types are provided such that an aggregate emission height for the multiple LED chips and/or the multiple LED package is provided with improved uniformity. In certain aspects, thicknesses of LED chips and/or lumiphoric material layers may be provided with predetermined values based on the intended arrangement of the LED chips in proximity with other LED chips, either in separate LED packages that are arranged together or within a common multi-chip LED package. In this manner, emission heights for LED chips and/or LED packages with differing emission types may be substantially the same, or within 25%, or within 10%, or within 5%, or within 1% of one another. In specific examples, emission heights for LED chips and/or LED packages with differing emission types may be substantially the same, or within 100 microns (µm), or within 75 µm or within 60 µm, or within 30 µm, or within 15 µm of one another. Larger values, such as within 25% or within 100 µm, may be well suited for providing improved uniformity of emission heights across many different types of LED chips and/or LED packages with many different types of emission colors. The larger values may also be suitable for smaller groups of LED chips and/or LED packages, even as few as two different types, that have larger differences in emission colors. In certain embodiments, the smaller values, such as within 10% or within 30 µm, may be applicable for both many different types of emission colors and embodiments with smaller groups of LED chips and/or LED packages.

Figure 2:
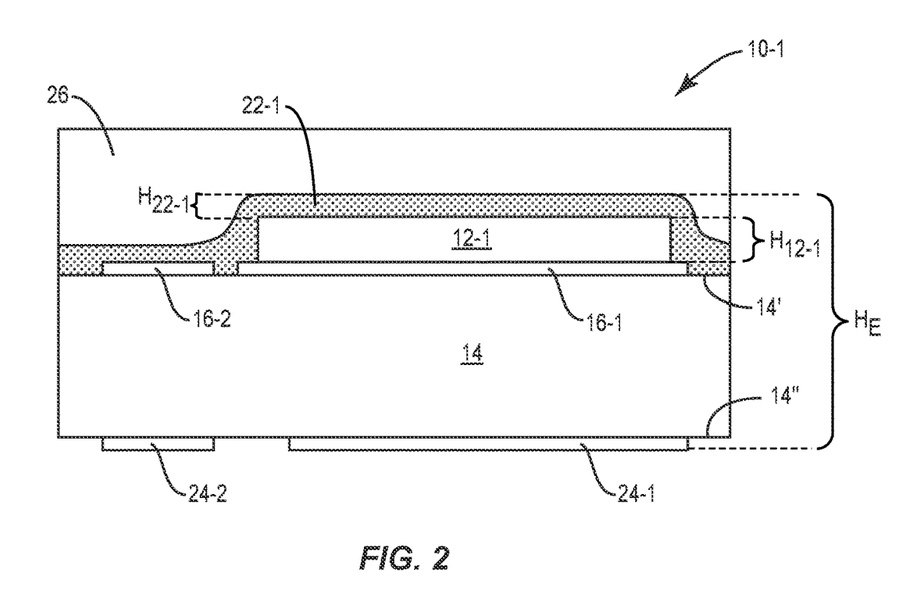
FIG. 2 is a cross-section of the LED package taken along the sectional line A-A of FIG. 1 for an LED chip that includes a lumiphoric material layer arranged thereon.
Figure 3:
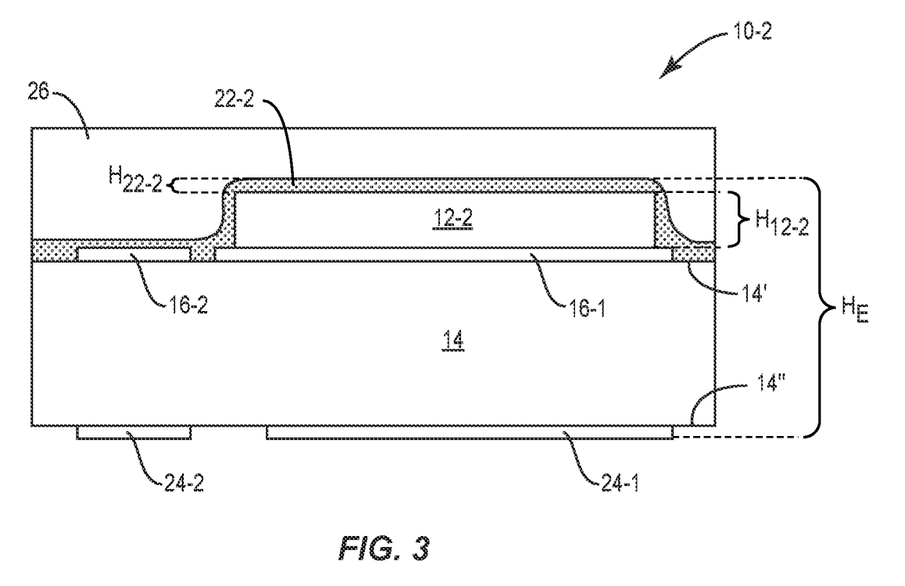
FIG. 3 is a cross-section of another arrangement of the LED package taken along the sectional line A-A of FIG. 1 that provides a different emission color than the LED package of FIG. 2.
Figure 4:
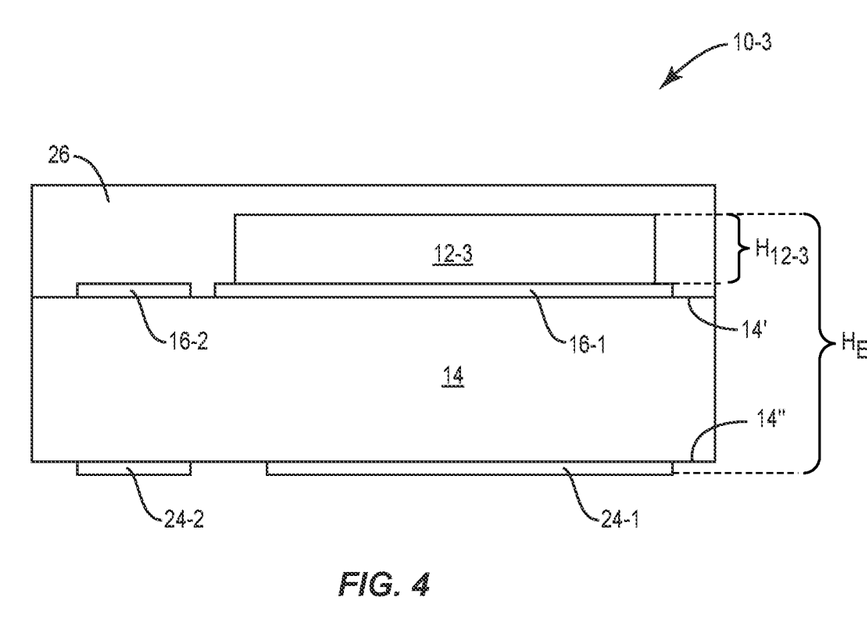
FIG. 4 is a cross-section of another arrangement of the LED package taken along the sectional line A-A of FIG. 1 that provides a different emission color than the LED package of FIG. 2 and the LED package of FIG. 3.

FIGS. 2 to 4 illustrate various embodiments of LED packages 10-1 to 10-3 that are configured to provide different emission colors or wavelengths while also providing an emission height $H_E$ that is the same or similar for each of the LED packages 10-1 to 10-3. The views provided in FIGS. 2 to 4 correspond with cross-sections taken along the sectional line A-A of FIG. 1.

FIG. 2 is a cross-section of the LED package 10-1 taken along the sectional line A-A of FIG. 1 for an LED chip 12-1 that includes a lumiphoric material layer 22-1 arranged thereon. The LED package 10-1 includes an arrangement of mounting pads 24-1 to 24-2 on a second side 14" or mounting side of the submount 14 that is opposite the first side 14'. The mounting pads 24-1 to 24-2 may be electrically coupled to respective metal traces 16-1 to 16-2 by way of vias that extend through portions of the submount 14 not visible in the cross-section of FIG. 2. In certain embodiments, the lumiphoric material layer 22-1 may be provided as a conformal coating that covers the LED chip 12-1 and surfaces of the submount 14 that are adjacent the LED chip 12-1. In other embodiments, the lumiphoric material layer 22-1 may be arranged just on the LED chip 12-1. An encapsulant 26 that is light-transmissive and/or light-transparent to light from the LED chip 12-1 and/or the lumiphoric material layer 22-1 may be provided over the lumiphoric material layer 22-1 and the LED chip 12-1 on the submount 14. Many different materials may be used for the encapsulant 26, including silicones, plastics, epoxies or glass, with a suitable material being compatible with molding processes.

In order to provide a target color for the LED package 10-1, the lumiphoric material layer 22-1 may be provided with a height $H_{22-1}$ above the LED chip 12-1 that provides suitable wavelength conversion for the target color. The height $H_{22-1}$ may be determined by any number of factors to provide the target color, such as a loading percentage and/or particle size of lumiphoric particles within the lumiphoric material layer 22-1. In a specific example, the LED package 10-1 may be configured to provide an emission color or color point that corresponds with generally white light, such as warm, neutral, or cool white. In such an example, the LED chip 12-1 may be configured to provide blue wavelengths (e.g., 430 nm to 480 nm) of light, and the lumiphoric material layer 22-1 may be configured to provide one or more of cyan, green, amber, yellow, orange, and/or red peak wavelengths that when combined with the blue wavelengths of the LED chip 12-1, provide aggregate white emissions. In another example, the LED package 10-1 may be configured to provide a saturated color target where aggregate emissions are substantially provided by the lumiphoric material layer 22-1. For example, the lumiphoric material layer 22-1 may be provided with a loading percentage such that a substantial majority of emissions from the LED chip 12-1 are subject to wavelength conversion. In this regard, aggregate emissions from the LED package 10-1 are provided with a color that is substantially wavelength-converted light. For example, the LED package 10-1 may be configured to provide an emission color or color point that is primarily cyan, green, amber, yellow, orange, red, or mint emissions, among others. The emission height $H_E$ for the LED package 10-1 may be defined as a perpendicular distance from a bottom of the mounting pads 24-1, 24-2, or mounting surface, to the topmost surface of the lumiphoric material layer 22-1. As illustrated, the emission height $H_E$ includes both the height $H_{22-1}$ of the lumiphoric material layer 22-1 and a height $H_{12-1}$ of the LED chip 12-1 in addition to the submount 14, metal traces 16-1, 16-2, and the mounting pads 24-1, 24-2. When the mounting pads 24-1, 24-2 are not present on the second side 14'' of the submount 14, the emission height $H_E$ may be defined as a perpendicular distance from the second side 14'' of the submount 14, or mounting surface, to the topmost surface of the lumiphoric material layer 22-1.

FIG. 3 is a cross-section of another arrangement of the LED package 10-2 taken along the sectional line A-A of FIG. 1 that provides a different emission color than the LED package 10-1 of FIG. 2. The LED package 10-2 may be similar to the LED package 10-1 of FIG. 2, but the combination of an LED chip 12-2 and a lumiphoric material layer 22-2 provide a different emission color or color point. For example, the LED chip 12-2 may be configured to provide blue wavelengths (e.g., 430 nm to 480 nm) of light, and the lumiphoric material layer 22-2 may be configured to provide one or more of cyan, green, amber, yellow, orange, and/or red peak wavelengths that when combined with the blue wavelengths of the LED chip 12-2, provide different aggregate emissions than the LED package 10-1 of FIG. 2. In certain embodiments, a height $H_{22-2}$ of the lumiphoric material layer 22-2 above the LED chip 12-2 may be less than the height $H_{22-1}$ of the lumiphoric material layer 22-1 of FIG. 2. According to principles of the present disclosure, the LED chip 12-2 may be provided with a height $H_{12-2}$ that is greater than the height $H_{12-1}$ of the LED chip 12-1 in FIG. 2 such that the emission height $H_E$ of both LED packages 10-1, 10-2 are the same or similar.

FIG. 4 is a cross-section of another arrangement of the LED package 10-3 taken along the sectional line A-A of FIG. 1 that provides a different emission color or color point than the LED package 10-1 of FIG. 2 and the LED package 10-2 of FIG. 3. In FIG. 4, the LED package 10-3 does not include a lumiphoric material layer. In this regard, emissions from the LED package 10-3 are generated only by the LED chip 12-3 to provide monochromatic emissions, such as blue wavelengths (e.g., 430 nm to 480 nm), or green wavelengths (e.g., 500 nm to 570 nm), or red wavelengths (e.g., 600 nm to 650 nm). The above wavelength ranges are provided as examples, and in practice the LED chip 12-3 may be configured to emit any wavelength of light depending on the application. Since no lumiphoric material layer is present, the emission height $H_E$ is defined as a perpendicular distance from a bottom of the mounting pads 24-1, 24-2, or the second side 14'' when the mounting pads 24-1, 24-2 are not present, to a topmost surface of the LED chip 12-3. In order to provide the emission height $H_E$ of the LED package 10-3 the same or similar to the LED package 10-1 of FIG. 2 and the LED package 10-2 of FIG. 3, the height $H_{12-3}$ of the LED chip 12-3 may be larger than both the heights $H_{12-1}$, $H_{12-2}$ of the LED chips 12-1, 12-2 of FIGS. 3 and 4.

Figure 5:
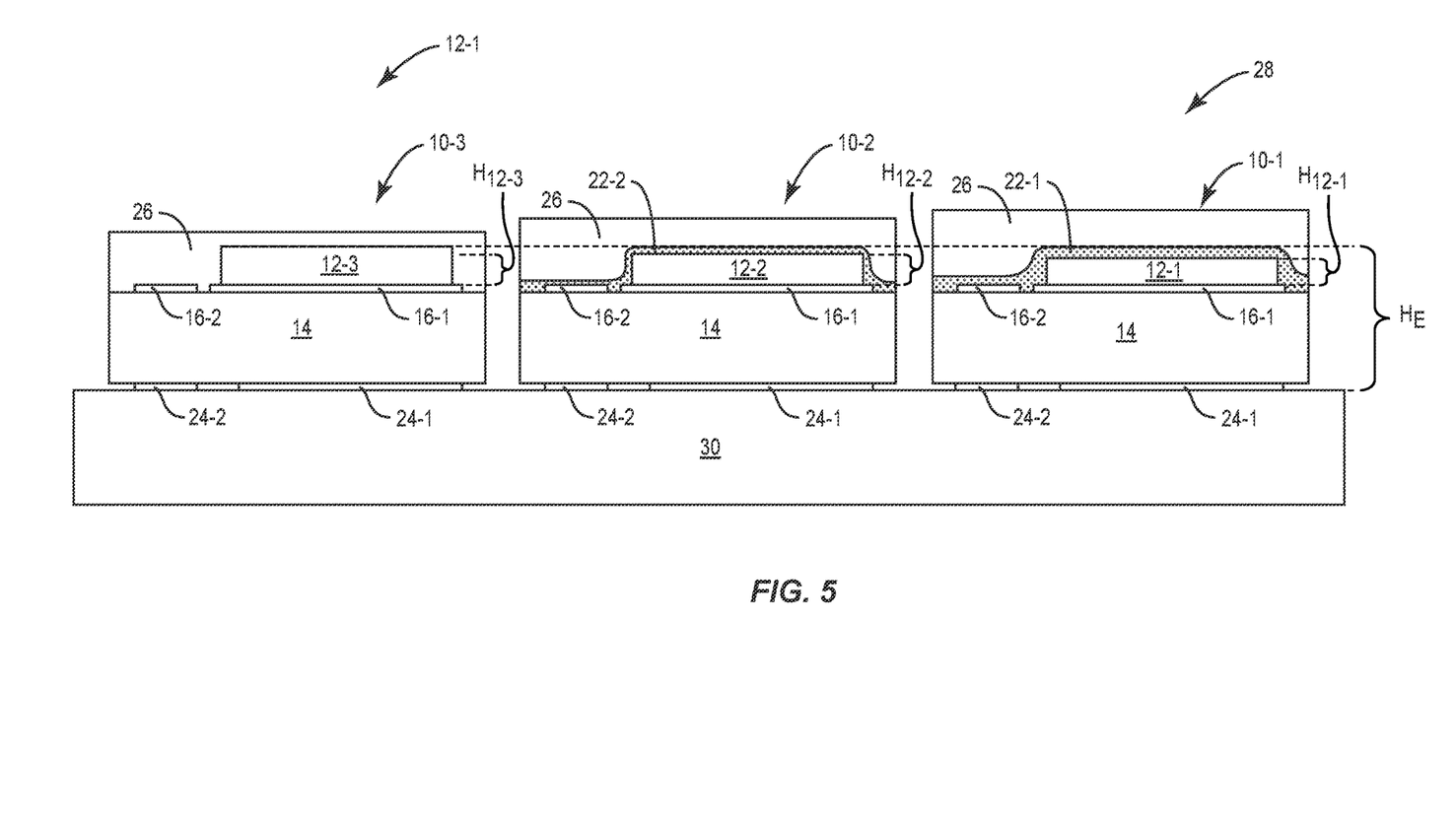
FIG. 5 is a cross-section of a light-emitting device that includes each of the LED packages of FIGS. 2 to 4.

FIG. 5 is a cross-section of a light-emitting device 28 that includes each of the LED packages 10-1 to 10-3 of FIGS. 2 to 4. The light-emitting device 28 may embody a lighting fixture or a lighting module that may be incorporated within a larger lighting system. The LED packages 10-1 to 10-3 may be mounted in proximity to one another on a support element 30, such as a printed circuit board. According to principles of the present disclosure, relative heights $H_{12-1}$ to $H_{12-3}$, or thicknesses, of the LED chips 12-1 to 12-3 are specifically selected to compensate for differences in the lumiphoric material layers 22-1, 22-3 so that a common emission height $H_E$ is provided across the light-emitting device 28. Based on the target emission colors for each of the LED packages 10-1 to 10-3, the differences in heights $H_{12-1}$ to $H_{12-3}$ of the LED chips 12-1 to 12-3 may exceed normal variations in chip heights. For example, the height $H_{12-1}$ of the LED chip 12-1 may be provided in a range that is 45% to 65% of the height $H_{12-3}$ of the LED chip 12-3, and the height $H_{12-2}$ of the LED chip 12-2 may be provided in a range that is 65% to 85% of the height $H_{12-3}$ of the LED chip 12-3. In a specific example, the height $H_{12-1}$ of the LED chip 12-1 may be provided in a range from 120 μm to 140 μm, the height $H_{12-2}$ of the LED chip 12-2 may be provided in a range from 155 μm to 175 μm, and the height $H_{12-3}$ of the LED chip 12-3 may be provided in a range from 215 μm to 235 μm. In certain embodiments, each of the above-described height differences, either in percentages or actual values, may be applicable for embodiments where each of the LED chips 12-1 to 12-3 are configured to emit a same or similar wavelength of light, such in a range from 430 nm to 480 nm. In such embodiments, differences in emissions provided by each of the LED packages 10-1 to 10-3 may therefore be provided by differences in the lumiphoric material layers 22-2, 22-3 in the LED packages 10-1, 10-2 and the absence of lumiphoric materials in the LED package 10-3. In other embodiments, one or more of the LED chips 12-1 to 12-3 may be configured to emit a different emission wavelength than one or more of the other LED chips 12-1 or 12-3.

While the emission height $H_E$ is illustrated as the same across each of the LED packages 10-1 to 10-3 in FIG. 5, slight variations may also present while still providing an overall light-emitting surface with improved uniformity for the light-emitting device 28. In this manner, the emission height $H_E$ may be substantially the same, or within 25%, or within 10%, or within 5%, or within 1% across each of the LED packages 10-1 to 10-3. In specific examples, the emission height $H_E$ may be substantially the same, or within 100 µm, or within 75 µm, or within 60 µm, or within 30 µm, or within 15 µm across each of the LED packages 10-1 to 10-3. While FIG. 5 illustrates an example where three LED packages 10-1 to 10-3 of different emission colors are configured with a same or similar emission height $H_E$, the principles described herein are applicable to many combinations of LED packages that provide many different emission colors. For example, in certain embodiments, at least 2, or at least 5, or at least 10, or at least 15, or at least 20, or in a range from 2 to 20, or in a range from 5 to 20 different LED packages, each of which is configured to provide a different target emission color, may be arranged to have an emission height that is substantially the same, or within 25%, or within 10%, or within 5%, or within 1% of one another, or within 100 µm, or within 75 µm, or within 60 µm, or within 30 µm, or within 15 µm of one another.

In certain aspects, the differences in heights between LED chips may be predetermined based on target emission colors of LED packages in which the LED chips will be provided. As described above, certain embodiments involve LED chips that are configured to emit a same emission color that will be arranged with different lumiphoric materials in different LED packages, or in LED packages without lumiphoric materials. In other embodiments, LED chips may be configured to emit different emission colors. In either case, differences in heights between LED chips may be provided before the LED chips are mounted within respective LED packages. In certain embodiments, the differences in heights may be provided by removing and/or thinning certain portions of LED chips, such as LED chip substrates, with differing amounts from one another. As used herein, an LED chip substrate may refer to a growth substrate on which an active LED structure is epitaxially grown. In another example, an LED chip substrate may refer to a host substrate on which an active LED structure is supported, typically when a growth substrate has been removed.

Figure 6A:
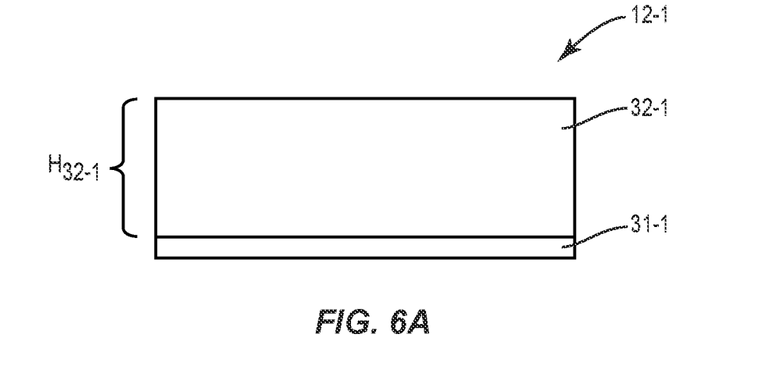
FIGS. 6A to 6C are cross-sections of LED chips that illustrate differences in heights or thicknesses between respective LED chip substrates that may be used to provide improved uniformity in emission heights according to principles of the present disclosure.
Figure 6B:
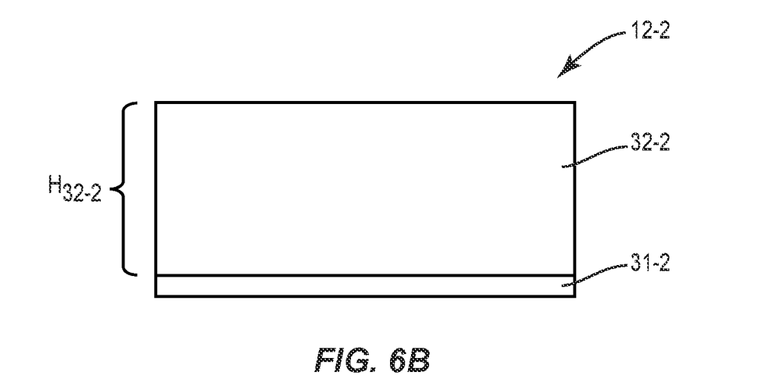
Figure 6C:
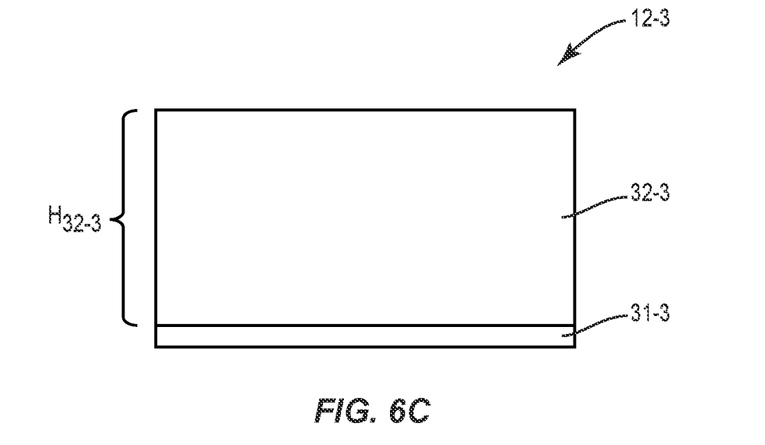

FIGS. 6A to 6C are cross-sections of LED chips 12-1 to 12-3 that illustrate differences in heights $H_{32\text{-}1}$ to $H_{32\text{-}3}$ or thicknesses between respective LED chip substrates 32-1 to 32-3. In each of FIGS. 6A to 6C, active LED structures 31-1 to 31-3 are generally illustrated on bottom sides of the LED chip substrates 32-1 to 31-3 as is typical for flip-chip mounting. However, the principles described herein are applicable to other chip structures, such as arrangements where LED chip substrates 32-1 to 32-3 are closer to mounting surfaces than the active LED structures 31-1 to 31-3. As illustrated, the height $H_{32\text{-}1}$ of the LED chip substrate 32-1 is smaller than the height $H_{32\text{-}2}$ of the LED chip substrate 32-2, and the height $H_{32\text{-}2}$ of the LED chip substrate 32-2 is smaller than the height $H_{32\text{-}3}$ of the LED chip substrate 32-3. During fabrication of the LED chips 12-1 to 12-3, thinning and/or planarization steps applied to the LED chip substrates 32-1 to 32-3 may be performed to provide the above-described height differences based on the intended color targets for each of the LED chips 12-1 to 12-3. In certain embodiments, at least two of the LED chips 12-1 to 12-3 may include the same type of active LED structures 31-1 to 31-3 configured to generate the same wavelength of light. By providing the above-described differences in heights $H_{32\text{-}1}$ to $H_{32\text{-}3}$, different ones of the LED chips 12-1 to 12-3 may be arranged with different amounts of lumiphoric materials or no lumiphoric materials at all to provide different overall emissions while also providing uniform emission heights between the LED chips 12-1 to 12-3.

While the above-described examples are provided in the context of different LED packages that are arranged with same or similar emission heights, the principles described here are also applicable to single LED packages that include multiple LED chips of different emission colors. In this regard, multiple-chip LED packages may be arranged with LED chips of different emission colors and/or different arrangements of lumiphoric materials while still providing same or similar emission heights within the multiple chip LED packages.

Figure 7A:
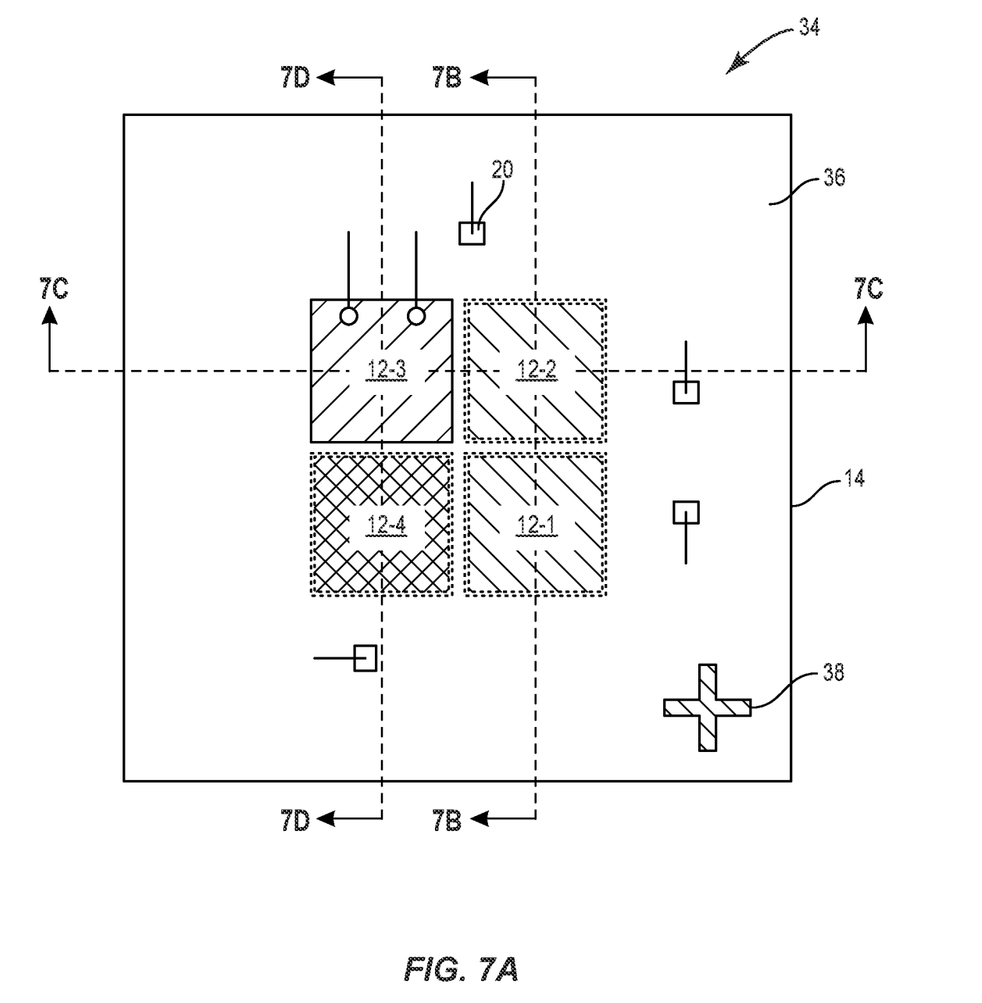
FIG. 7A is a top view of an LED package where multiple LED chips are assembled in close proximity to one another on the submount with improved uniformity in emission heights.

FIG. 7A is a top view of an LED package 34 where multiple LED chips 12-1 to 12-4 are assembled in close proximity to one another on the submount 14. The LED chips 12-1 to 12-4 may include various combinations of chip types and/or LED chip orientations. For example, different chip types may include a first LED chip 12-1 and corresponding lumiphoric material, a second LED chip 12-2 and corresponding lumiphoric material that provides a different color of light than the first LED chip 12-1, and a third LED chip 12-3 and a fourth LED chip 12-4 that do not include corresponding lumiphoric materials. It is contemplated that the principles described herein are applicable to many different combinations of chip types within the LED package 34. While only four LED chips 12-1 to 12-4 are illustrated, the principles disclosed are applicable to any number of LED chips within a common package, including at least 2, or at least 5, or at least 10, or at least 15, or at least 20, or in a range from 2 to 20, or in a range from 5 to 20 different LED chips within the LED package 34, each of which can be configured to provide a different target emission color. When assembled together according to the present disclosure, the LED package 34 may be arranged to have an emission height with improved uniformity. For example, an individual emission height for each the LED chips 12-1 to 12-4 may be substantially the same, or within 25%, or within 10%, or within 5%, or within 1% of one another, or within 100 µm, or within 75 µm, or within 60 µm, or within 30 µm, or within 15 µm of one another. In certain embodiments, different chip types may include different structures and/or orientations of the LED chips 12-1 to 12-4. For example, the third LED chip 12-3 may be arranged with a vertical orientation with electrical connections made on opposing sides while the LED chips 12-1, 12-2, and 12-4 may be arranged with flip-chip orientations where electrical connections are made from a same side and at an interface with the submount 14.

The LED package 34 may further include a light-altering material 36 that is arranged to cover portions of the submount 14 that are outside the LED chips 12-1 to 12-4. The light-altering material 36 may be formed with a light-reflective and/or light-refractive material so that light from the LED chips 12-1 to 12-4 may be redirected toward a desired emission direction for the LED package 34 with reduced light loss. In certain embodiments, the light-altering material 36 may be configured with a generally white color. As illustrated, the light-altering material 36 is arranged to extend from peripheral edges of the submount 14 to peripheral edges of each of the LED chips 12-1 to 12-4, and in between neighboring ones of the LED chips 12-1 to 12-4. In this regard, an aggregate light-emitting surface for the LED package 34 may be collectively formed by the top surfaces of the LED chips 12-1 to 12-4. While various ones of the electrical overstress elements 20 may be visible from the top view of FIG. 7A, the light-altering material 36 may be arranged to cover them over the submount 14. A polarity indicator 38 may be etched or otherwise formed on a surface of the light-altering material 36. In other embodiments, the polarity indicator 38 may be omitted or formed on a different portion of the LED package 34, such as a surface of the submount 14.

Figure 7B:
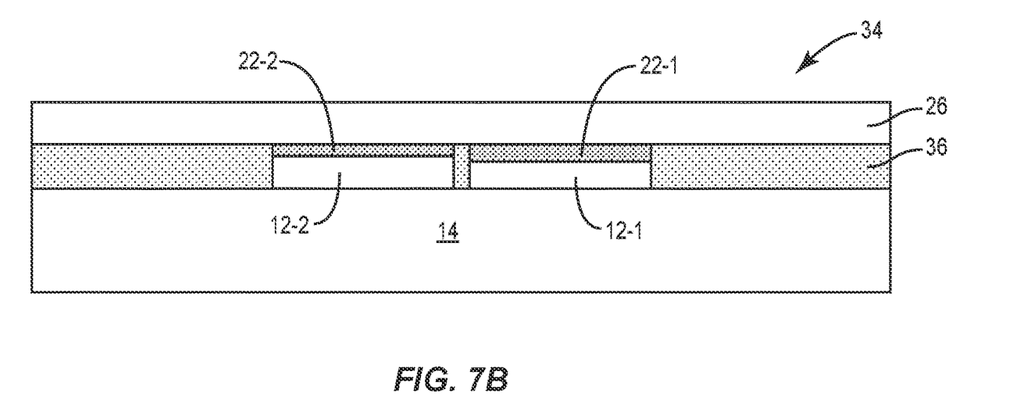
FIG. 7B is a cross-section of the LED package taken along the sectional line 7B-7B of FIG. 7A that includes the first LED chip with a first lumiphoric material and the second LED chip with a second lumiphoric material.

FIG. 7B is a cross-section of the LED package 34 taken along the sectional line 7B-7B of FIG. 7A that includes the first LED chip 12-1 with a first lumiphoric material layer 22-1 and the second LED chip 12-2 with a second lumiphoric material layer 22-2. In certain embodiments, the LED chips 12-1, 12-2 and corresponding lumiphoric material layers 22-1, 22-2 may be configured to provide different emission colors, such as different color temperatures of white light or at least one saturated color. In this regard, the height or thickness of the first lumiphoric material layer 22-1 may be greater than the height or thickness of the second lumiphoric material layer 22-2. As described above, the height or thickness of the respective LED chips 12-1, 12-2 may be predetermined with different values so that emission heights that include the LED chips 12-1, 12-2 and corresponding lumiphoric material layers 22-1, 22-2 are the same or similar. As illustrated, the light-altering material 36 may cover side surfaces of each of the LED chips 12-1, 12-2 and side surfaces of each of the lumiphoric material layers 22-1, 22-2. In certain embodiments, the light-altering material 36 may further be arranged between the LED chips 12-1, 12-2 and between the lumiphoric material layers 22-1, 22-2. The encapsulant 26 may be arranged across the lumiphoric material layers 22-1, 22-2 and the light-altering material 36 and in certain embodiments, the encapsulant 26 may extend entirely to be aligned with peripheral edges of the submount 14.

Figure 7C:
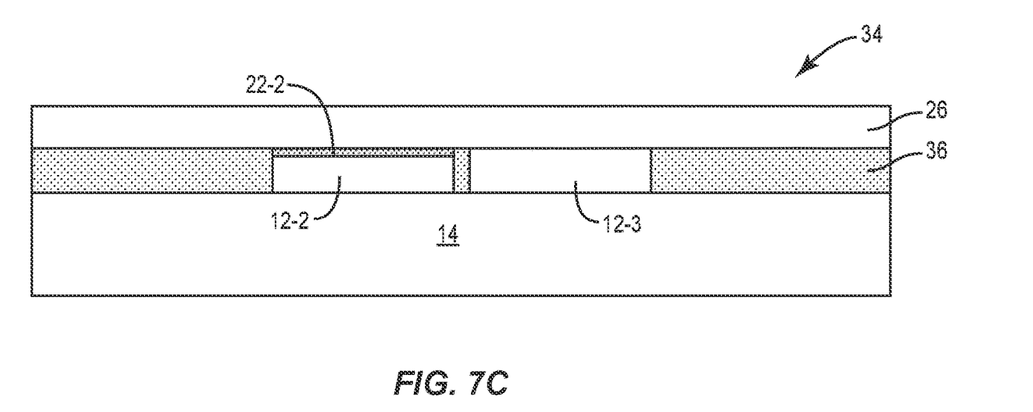
FIG. 7C is a cross-section of the LED package taken along the sectional line 7C-7C of FIG. 7A that includes the second LED chip and the third LED chip.

FIG. 7C is a cross-section of the LED package 34 taken along the sectional line 7C-7C of FIG. 7A that includes the second LED chip 12-2 and the third LED chip 12-3. In certain embodiments, the third LED chip 12-3 may be devoid of an associated lumiphoric material such that the third LED chip 12-3 is configured to provide monochromatic emissions. As illustrated, the height or thickness of the LED chips may be predetermined with different values so the emission heights as described above are the same or similar.

Figure 7D:
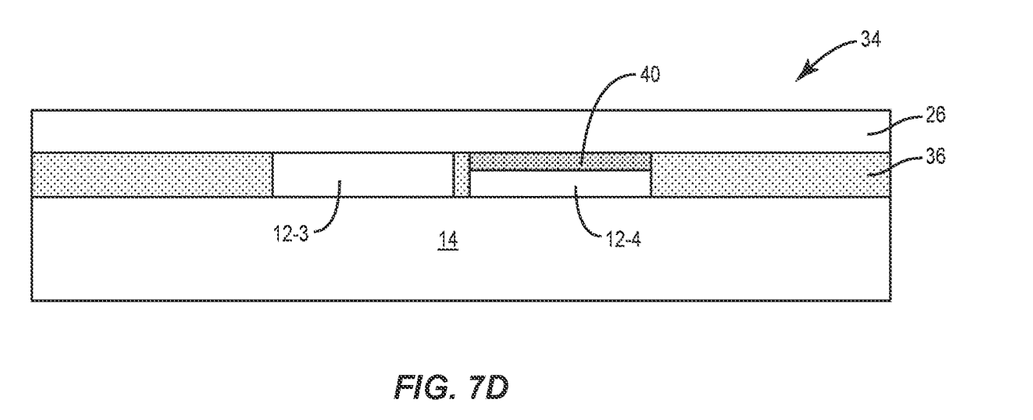
FIG. 7D is a cross-section of the LED package taken along the sectional line 7D-7D of FIG. 7A that includes the third LED chip and the fourth LED chip.

FIG. 7D is a cross-section of the LED package 34 taken along the sectional line 7D-7D of FIG. 7A that includes the third LED chip 12-3 and the fourth LED chip 12-4. In certain embodiments, the fourth LED chip 12-4 may include a chip cover 40 that is provided on a top surface thereof. As used herein, the chip cover 40 may also be referred to as a cover structure. As illustrated, a height of the chip cover 40 may be selected to be formed at a same or similar height as the emission height of the third LED chip 12-3. In certain embodiments, the chip cover 40 may include a lumiphoric material. For example, the chip cover may embody a phosphor-in-glass structure, a ceramic phosphor plate, or a pre-cured phosphor-in-silicone structure. In other embodiments, the chip cover may embody a light-transmissive or light-transparent cover, such as glass or silicone. In still further embodiments, the chip cover 40 may embody a light-transmissive or light-transparent cover with a layer of lumiphoric material formed thereon.

While the LED package 34 is described in the context of a multiple-chip package, the principles described are applicable to embodiments where each of the LED chips 12-1 to 12-4 are arranged alone in a package with all of the other elements described for the LED package 34. In this regard, the principles described for FIGS. 7A-7D are applicable to providing a separate package for each LED chip 12-1 to 12-4 such that emission heights between the different packages are the same or similar as described above. As such, each individual package would be the same as illustrated for the LED package 34, just with a single one of the LED chips 12-1 to 12-4. In still further embodiments, two different LED packages may be provided, each with a different thickness of the chip cover 40 to provide the same or similar emission height.

As illustrated in FIGS. 7A to 7D, the LED package 34 may be provided with different LED chips 12-1 to 12-4 that provide different emission colors, while also having a same or similar overall emission height for the LED package 34. Differences in lumiphoric material layers 22-1, 22-2, and lack thereof, may be accommodated by providing predetermining thicknesses for each of the LED chips 12-1 to 12-4. In this regard, the common emission height for the LED package 34 may provide aggregate emissions with improved uniformity and color mixing.

Figure 8:
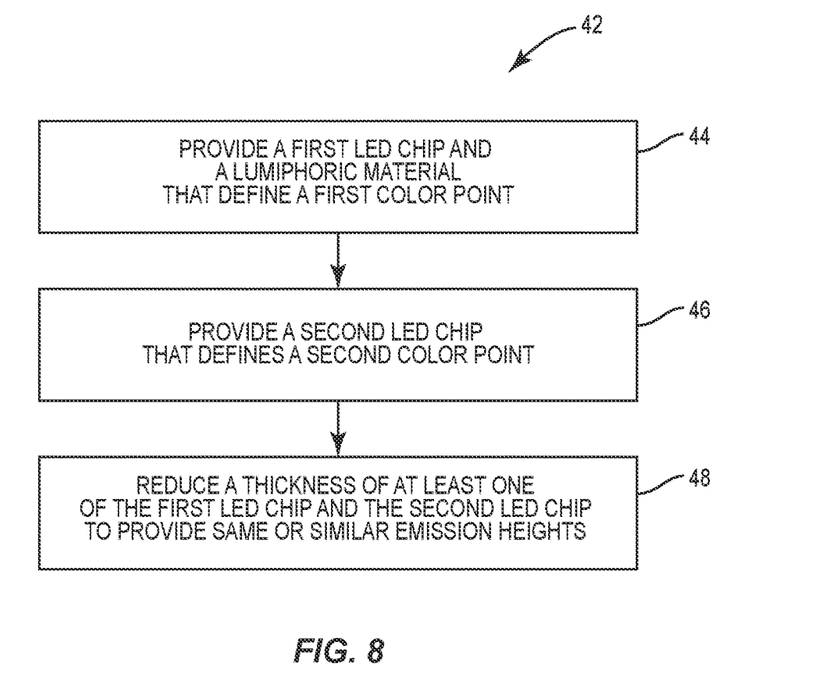
FIG. 8 illustrates an exemplary fabrication sequence to improve emission height uniformity between a first LED chip that includes a lumiphoric material and a second LED chip.
Figure 9:
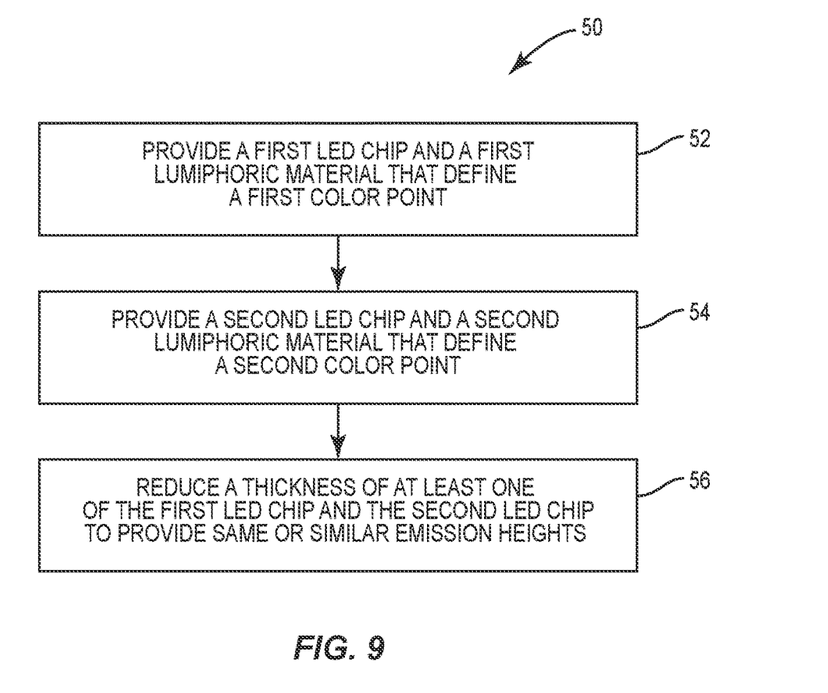
FIG. 9 illustrates another exemplary fabrication sequence to improve emission height uniformity between a first LED chip that includes a first lumiphoric material and a second LED chip that includes a second lumiphoric material.

Various fabrication sequences may be implemented to provide uniform emission heights for LED chips and/or LED packages of different emission colors. FIGS. 8 and 9 represent exemplary fabrication sequences for reducing thicknesses of LED chips based on targeted color points for improved emission height uniformity.

FIG. 8 illustrates an exemplary fabrication sequence 42 to improve emission height uniformity between a first LED chip that includes a lumiphoric material and a second LED chip. In a first step 44, a first color point is provided or determined based on an intended light output for the first LED chip and lumiphoric material. The first LED chip and lumiphoric material may embody any of the LED chip 12-1 and lumiphoric material layer 22-1 of FIG. 2, the LED chip 12-2 and lumiphoric material layer 22-2 of FIG. 3, or the LED chips 12-1, 12-2 of FIGS. 7A to 7D. The first color point may determine an amount or thickness of the corresponding lumiphoric material that is provided on the first LED chip. In a second step 46, a second color point based on a light output of the second LED chip is provided. In certain embodiments, the second color point may correspond to emissions generated by the active LED structure of the second LED chip. In this manner, the second LED chip may be devoid of a corresponding lumiphoric material. For example, the second LED chip may embody any of the LED chip 12-3 of FIG. 4, or the LED chips 12-3 or 12-4 of FIGS. 7A to 7D. In a third step 48, a thickness of one or more of the first LED chip and the second LED chip may be reduced so that emission heights between the first LED chip and the second LED chip may be the same or similar as described above. In one example, both the first LED chip and the second LED chip may be formed with a same thickness and the thickness of the first LED chip may subsequently be reduced by an amount that corresponds to a thickness of the corresponding lumiphoric material. In another example, the first LED chip and the second LED chip may be initially formed with different thicknesses. As such, both the first LED chip and the second LED chip may have their respective thicknesses reduced in amounts that provide uniform emission heights. In yet another example, the chip cover (e.g., 40 of FIG. 7D) may be utilized alone or in combination with reducing a thickness of at least one of the first LED chip and the second LED chip to achieve the same or similar emission heights.

FIG. 9 illustrates another exemplary fabrication sequence 50 to improve emission height uniformity between a first LED chip that includes a first lumiphoric material and a second LED chip that also includes a second lumiphoric material. The first LED chip and corresponding first lumiphoric material and the second LED chip and corresponding second lumiphoric material may embody any of the LED chip 12-1 and lumiphoric material layer 22-1 of FIG. 2, the LED chip 12-2 and lumiphoric material layer 22-2 of FIG. 3, or the LED chips 12-1, 12-2 of FIGS. 7A to 7D. In a first step 52, a first color point is provided or determined based on an intended light output for the first LED chip and the first lumiphoric material. In a second step 54, a second color point is provided or determined based on an intended light output for the second LED chip and second lumiphoric material. In a third step 56, a thickness of one or more of the first LED chip and the second LED chip may be reduced so that emission heights between the first LED chip and the second LED chip may be the same or similar as described above. In another example, the chip cover (e.g., 40 of FIG. 7D) may be utilized alone or in combination with reducing a thickness of at least one of the first LED chip and the second LED chip to achieve the same or similar emission heights.

It is contemplated that any of the foregoing aspects, and/or various separate aspects and features as described herein, may be combined for additional advantage. Any of the various embodiments as disclosed herein may be combined with one or more other disclosed embodiments unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:

1. A method comprising:
    providing a first light-emitting diode (LED) chip and a first lumiphoric material layer that define a first color point;
    providing a second LED chip that defines a second color point that is different than the first color point; and
    reducing a thickness of at least one of the first LED chip and the second LED chip such that a first emission height formed by the first LED chip and the first lumiphoric material layer is within 100 microns (µm) of a second emission height of the second LED chip.
2. The method of claim 1, wherein the first emission height is defined as a perpendicular distance from a mounting surface of the first LED chip to a topmost emission surface of the first LED chip, and the second emission height is defined as a perpendicular distance from a mounting surface of the second LED chip to a topmost emission surface of the second LED chip.
3. The method of claim 2, wherein the topmost emission surface of the first LED chip is defined at a topmost surface of the first lumiphoric material layer and the topmost emission surface of the second LED chip is defined at a topmost surface of the second LED chip.
4. The method of claim 1, wherein the thickness of the first LED chip is reduced by an amount that corresponds with a thickness of the first lumiphoric material layer.
5. The method of claim 1, wherein reducing a thickness of at least one of the first LED chip and the second LED chip comprises reducing a thickness of a substrate of at least one of the first LED chip and the second LED chip.
6. The method of claim 1, wherein the first emission height is within 60 µm of the second emission height.
7. The method of claim 1, wherein the first emission height is within 30 µm of the second emission height.
8. The method of claim 1, wherein the first LED chip is on a first submount, and the second LED chip is on a second submount that has a same height as the first submount.
9. A method comprising:
    providing a first light-emitting diode (LED) chip and a first lumiphoric material layer that define a first color point;
    providing a second LED chip and a second lumiphoric material layer that define a second color point that is different than the first color point; and
    reducing a thickness of at least one of the first LED chip and the second LED chip such that a first emission height formed by the first LED chip and the first lumiphoric material layer is within 100 microns (µm) of a second emission height formed by the second LED chip and the second lumiphoric material layer.
10. The method of claim 9, wherein the first emission height is defined as a perpendicular distance from a mounting surface of the first LED chip to a topmost emission surface of the first LED chip, and the second emission height is defined as a perpendicular distance from a mounting surface of the second LED chip to a topmost emission surface of the second LED chip.
11. The method of claim 10, wherein the topmost emission surface of the first LED chip is defined at a topmost surface of the first lumiphoric material layer and the topmost emission surface of the second LED chip is defined at a topmost surface of the second lumiphoric material layer.
12. The method of claim 9, wherein reducing a thickness of at least one of the first LED chip and the second LED chip comprises reducing a thickness of a substrate of at least one of the first LED chip and the second LED chip.
13. The method of claim 9, wherein the first emission height is within 60 µm of the second emission height.
14. The method of claim 9, wherein the first emission height is within 30 µm of the second emission height.
15. The method of claim 9, wherein the first LED chip and the second LED chip are on a same mounting surface of a submount.

* * * * *